United States Patent [19]

Abe et al.

[11] Patent Number: 4,853,760
[45] Date of Patent: Aug. 1, 1989

[54] SEMICONDUCTOR DEVICE HAVING INSULATING LAYER INCLUDING POLYIMIDE FILM

[75] Inventors: Masahiro Abe, Yokohama; Masaharu Aoyama, Fujisawa; Jiro Ohshima, Yokohama; Takashi Ajima, Kamakura, all of Japan

[73] Assignee: Tokyo Shibaura Denki Kabushiki Kaisha, Kawasaka, Japan

[21] Appl. No.: 89,959

[22] Filed: Aug. 25, 1987

Related U.S. Application Data

[63] Continuation of Ser. No. 429,435, Sep. 30, 1982, abandoned.

[30] Foreign Application Priority Data

Dec. 12, 1981 [JP] Japan ................................ 56-199501

[51] Int. Cl.⁴ .................. H01L 29/34; H01L 29/167; H01L 23/48
[52] U.S. Cl. .......................... 357/52; 357/54; 357/63; 357/71; 357/91
[58] Field of Search ..................... 357/52, 54, 65, 68, 357/71, 30, 63, 91

[56] References Cited

U.S. PATENT DOCUMENTS

| | | | |
|---|---|---|---|
| 3,801,880 | 4/1974 | Harada et al. | 357/40 |
| 4,057,659 | 11/1977 | Pammer et al. | 357/71 |
| 4,081,292 | 3/1978 | Aoki et al. | 357/52 |
| 4,269,631 | 5/1981 | Anantha et al. | 357/91 |
| 4,393,092 | 7/1983 | Gill | 427/38 |

FOREIGN PATENT DOCUMENTS

| | | | |
|---|---|---|---|
| 52-69378 | 6/1976 | Japan | 357/52 |
| 53-207285 | 9/1978 | Japan | 357/52 |
| 56-42366 | 4/1981 | Japan | 357/91 |

OTHER PUBLICATIONS

Japanese Patent Disclosure (Kokai) No. 55-12773, Mitsubishi Electric Corporation.
PTO translation of above Japan 55-12773.

Primary Examiner—J. Carroll
Attorney, Agent, or Firm—Finnegan, Henderson, Farabow, Garrett, & Dunner

[57] ABSTRACT

A semiconductor device has a passivation layer including a polyimide film. Argon ions are implanted in the polyimide film to convert it into an electrically stable insulating film.

8 Claims, 11 Drawing Sheets

F I G. 3
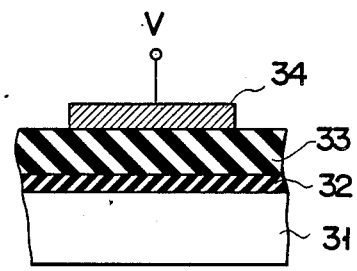
F I G. 4
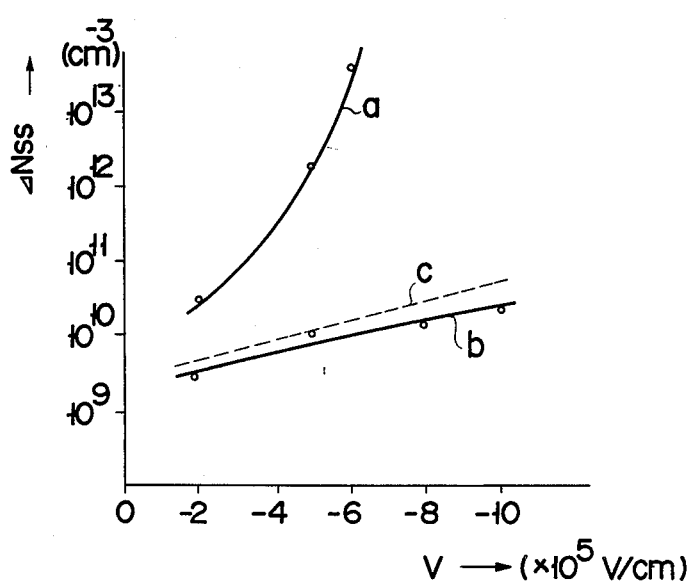

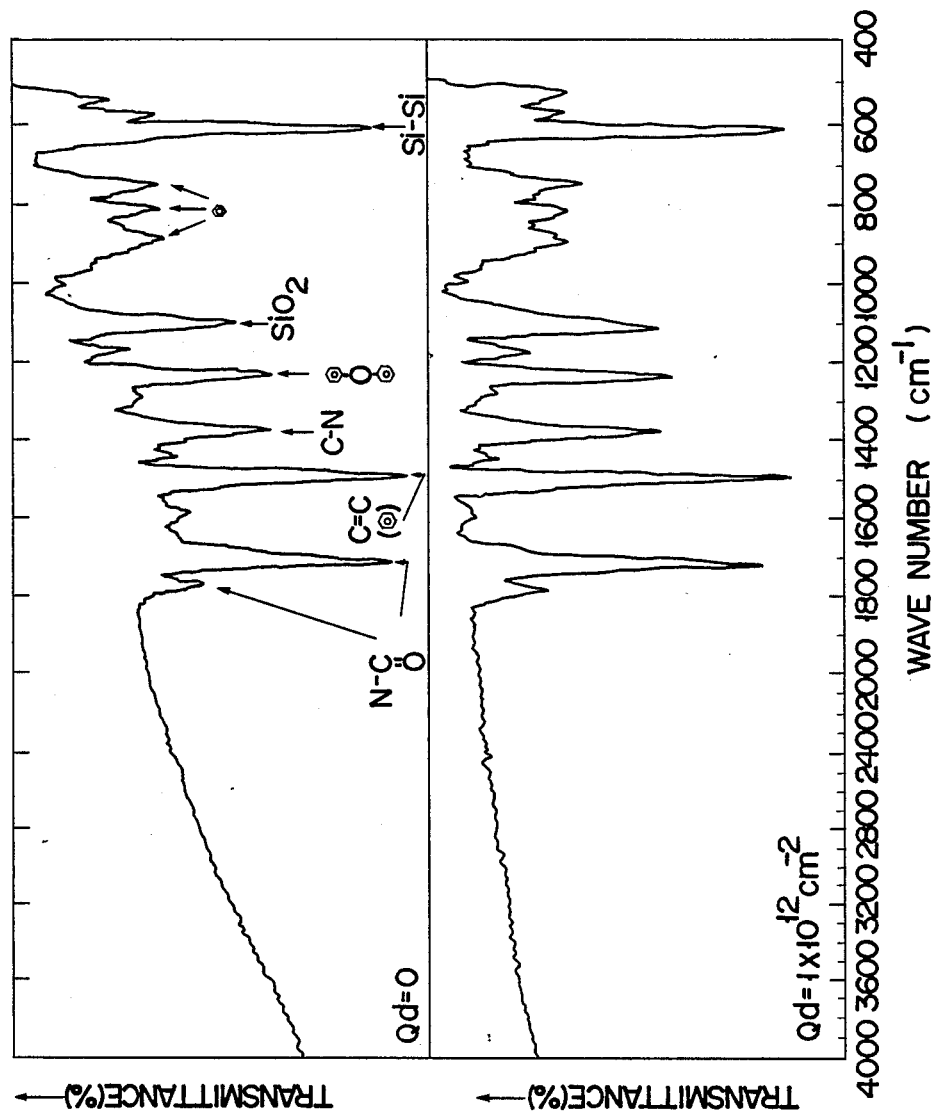
F I G. 5A
F I G. 5B

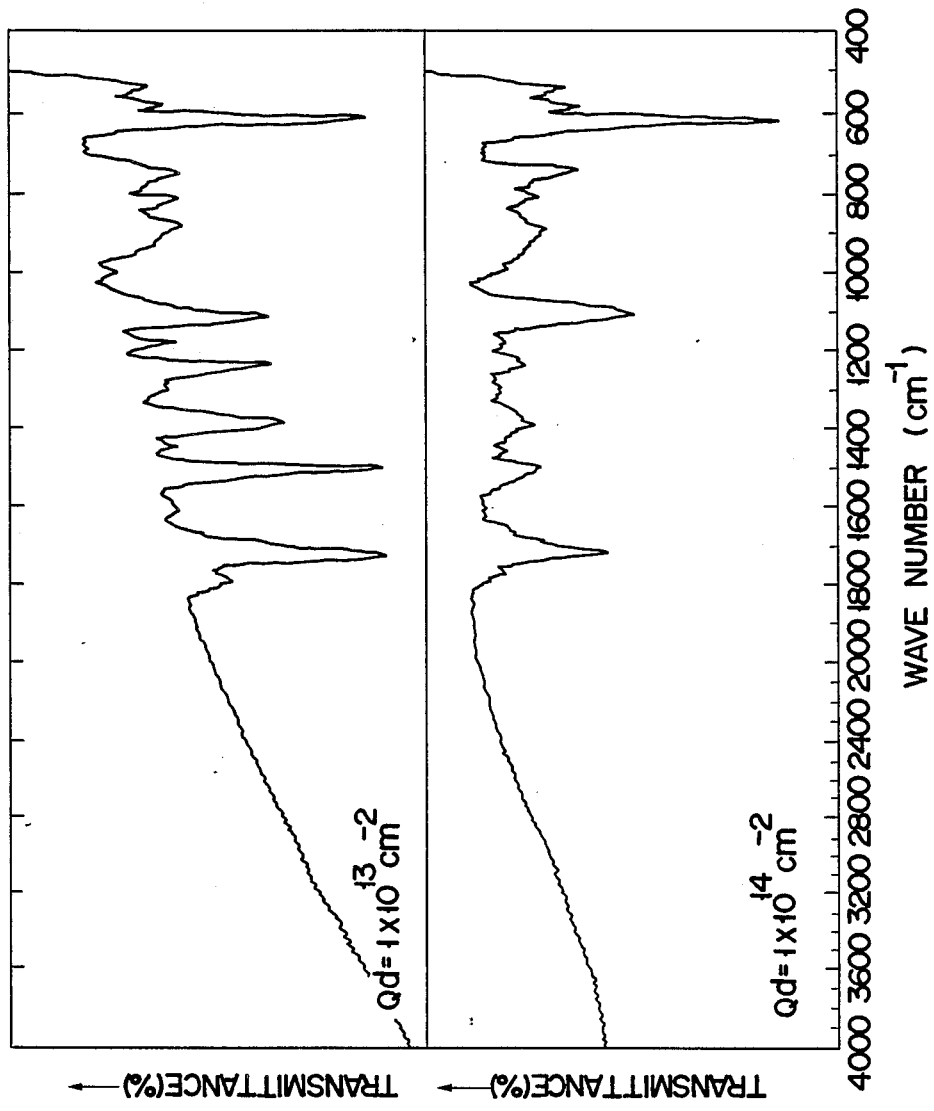

F I G. 7
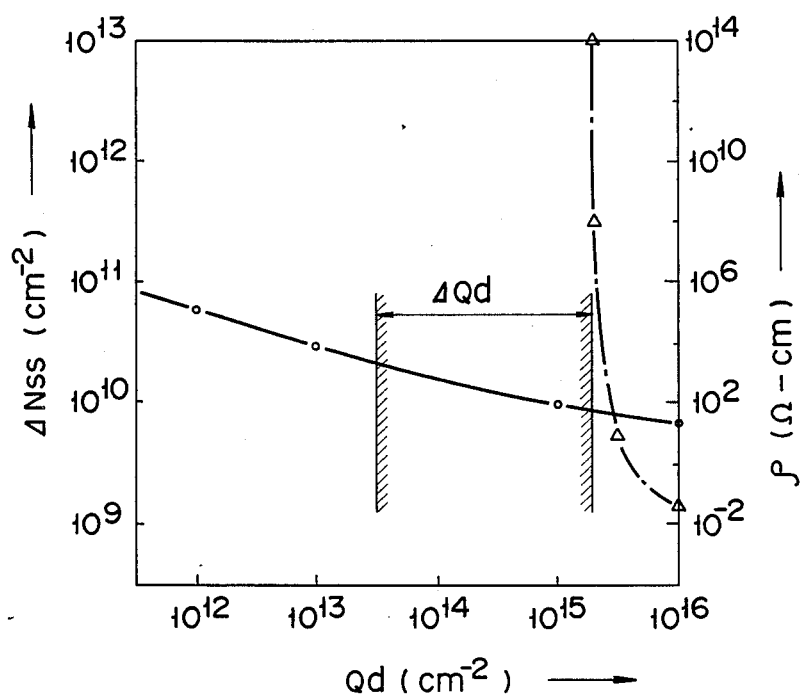

SEMICONDUCTOR DEVICE HAVING INSULATING LAYER INCLUDING POLYIMIDE FILM

This application is a continuation of application Ser. No. 429,435, filed Sept. 30, 1982, abandoned.

BACKGROUND OF THE INVENTION

I. Field of the Invention

The present invention relates to a semiconductor device which has an improved organic insulating film for preventing erroneous operation of an internal element thereof, and a method for manufacturing the same.

II. Description of the Prior Art

Conventionally, an inorganic insulating film such as a silicon oxide film or an organic insulating film such as a polyimide film has been used as a passivation film of a semiconductor device, especially, as an insulating interlayer of the multi-layer wiring.

A typical structure of a conventional multi-layer semiconductor device is shown in FIG. 1. A first wiring layer 3 is formed on an insulating layer 2 (generally, silicon oxide film) on a silicon substrate 1 in which diffusion regions are formed. An insulating interlayer 4 is formed on the first wiring layer 3. After a through hole is formed in the insulating interlayer 4, a second wiring layer 5 is formed.

An inorganic insulating film formed as the insulating interlayer 4 by the CVD (chemical vapor deposition) may be rendered electrically stable by proper selection of film-forming conditions. However, formation of the inorganic film requires a relatively high temperature of 400° to 600° C. The inorganic film can not smooth out indentations of the underlying film. Also damage, such as cracks, can occurs due to stress (caused by e.g., the different thermal expansion coefficients) between the films.

Although an organic insulating film can be readily obtained by coating, requires only a temperature only slightly above room temperature, has the ability to smoothout the underlying film, and decreases the stress between the films, organic insulating film is not electrically stable.

The above drawbacks of an organic insulating film are based on the fact that an organic polymer such as polyimide which forms the film has a dipole moment, and that polyimide is strongly polarized upon application of an electric field. For example, in a structure such as portion A surrounded by the broken line in FIG. 1, when a positive voltage is applied across the second wiring layer 5, the organic polymer forming the insulating interlayer 4 is polarized. As a result, a base region (p-type semiconductor region) 6 of a bipolar transistor formed in the silicon substrate 1 is inverted to an n-type semiconductor region, thus preventing normal operation of the transistor. Furthermore, even after the electric field is cleared, the organic material forming the insulating interlayer 4 remains polarized. This adversely affects the element formed in the silicon substrate 1.

In a semiconductor device which uses an organic insulating film as an insulating interlayer under the upper wiring layer, such as the second wiring layer, various limitations are imposed on the circuit design: e.g., the transistor element must not be formed immediately under the wiring layer; and any wiring layer across which a voltage is constantly applied must not be formed on the organic insulating film.

SUMMARY OF THE INVENTION

It is, therefore, an object of the present invention to provide a semiconductor device which does not impair the advantages of an organic insulating film and which also overcomes the most significant drawback, that is, electrical instability.

It is another object of the present invention to provide a method for manufacturing a semiconductor device which does not impair the advantages of an organic insulating film and which overcomes the most significant drawback, that is, electric instability.

It is still another object of the present invention to provide a method for manufacturing a multi-layer semiconductor device, wherein, changes in the silicon substrate surface state electron concentration due to the presence of the organic insulating film between multi-wiring layers are reduced to the minimum.

Additional objects and advantages of the invention will be set forth part in the description which follows, and in part will be obvious from the description, or may be learned by practice of the invention. The objects and advantages of the invention may be realized and attained by means of the instrumentalities and combinations particularly pointed out in the appended claims.

According to one aspect of the present invention, as embodied and broadly described herein, a semiconductor device is provided which includes a semiconductor substrate, at least one semiconductor element formed in the main surface region of the substrate by means of impurity diffusion, a polyimide film formed as an insulating layer on the main surface of the substrate, said polyimide film having implanted therein ions of an inert element, and a wiring layer formed on the polyimide film, a potential difference being provided between the potential applied to the semiconductor region and the potential applied to the wiring layer.

The accompanying drawings, which are incorporated in and constitute a part of this specification, illustrate one embodiment of the invention and together with the description, serve to explain the principles of the invention.

BRIEF DESCRIPTION OF THE DRAWINGS

FIG. 3 is a sectional view of a sample to evaluate electrical characteristics of an argon ion-implanted polyimide film by means of the MOS varactor method;

FIG. 4 is a graph for explaining the changes in the surface state electron concentration as a function of the applied voltage when the sample in FIG. 3 is used;

FIGS. 5A to 5F are graphs illustrating infra-red absorption spectra of argon ion-implanted and non-implanted polyimide films coated on a silicon substrate, according to infra-red spectroscopy (IR) analysis;

FIG. 7 is a graph for explaining changes in resistance of the polyimide film and changes in the surface state electron concentration in accordance with changes in the dose of the argon ions.

DETAILED DESCRIPTION OF THE PREFERRED EMBODIMENT

It is generally considered that upon being radiated an organic material is degraded by its structural changes due to formation of the free radicals, ionization, depolymerization, and cross-linking. For example, when $Ar^+$ ions are doped in a polyimide insulating film, polyimide molecules are dissociated or carbonated in a broad sense. The present inventors, however, have found that, when a proper amount of ions is implanted into the polyimide film, an electrically stable insulating film can be obtained. In other words, it is found that an insulating film is obtained which does not adversely affect the element formed in the semiconductor substrate and which is not polarized even if an electric field is applied. Inherent characteristics of the polyimide, such as volume resistivity and moisture permeability, may not be degraded. A change in the surface state electron concentration $\Delta Nss$ of the silicon substrate measured by the MOS varactor method is greatly improved when the implanted polyimide film is applied according to the invention.

It is found that the conversion of the polyimide film as described above is effected by Kr, Xe, $He^+$, C, or N ions as well as $Ar^+$ ions However, $Ar^+$ ions which are chemically inert are used herein to examine the conversion in detail.

Figure 1:
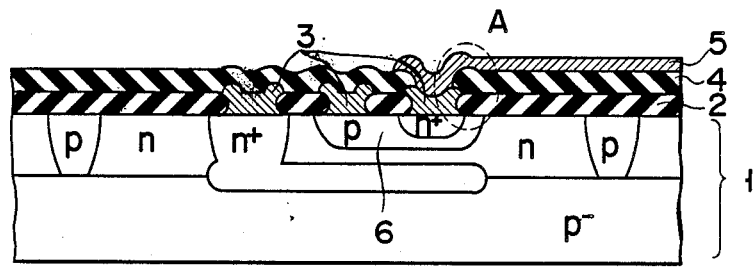
FIG. 1 is a sectional view of a conventional multi-layer semiconductor device.
Figure 2A:
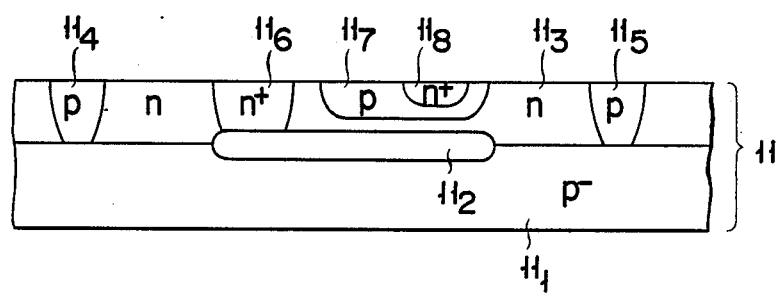
FIGS. 2A to 2E are sectional views for explaining the steps of manufacturing a semiconductor device constructed according to the preferred an embodiment of the present invention.

FIGS. 2A to 2E are sectional views for explaining the steps of manufacturing a semiconductor device according to the preferred embodiment of the present invention. As shown in FIG. 2A, an impurity diffusion layer is formed in a semiconductor substrate (e.g., silicon substrate) 11 which has one major surface to form a semiconductor element. An $n^+$-type buried layer $11_2$ is formed on a $p^-$-type semiconductor substrate $11_1$. An n-type epitaxial layer $11_3$ is formed on the structure. P-type isolating regions $11_4$ and $11_5$ are formed. An $n^+$-type impurity diffusion region $11_6$ is formed to contact with the $n^+$-type impurity diffusion layer $11_2$, and at the same time, p- and n-type impurity diffusion regions $11_7$ and $11_8$ are formed as the base and emitter regions of the transistor. Thus, a bipolar transistor is formed in the substrate 11. However, any other element such as a MOSFET or CCD may be formed in accordance with the conventional method.

Figure 2B:
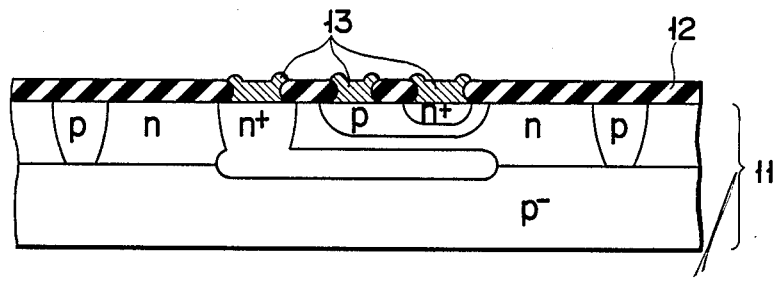
Figure 2C:
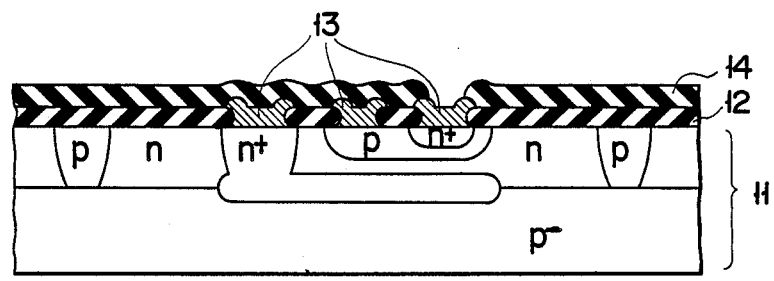

As shown in FIG. 2B, an insulating film 12 of about 1 $\mu$m thickness is formed on the major surface of the semiconductor substrate 11 in which the element is formed. The insulating film 12 is usually formed of $SiO_2$ though it may be formed of $Si_3N_4$. After the insulating film 12 is patterned, a first wiring layer 13 is formed on the insulating film 12. A polyimide-forming solution is applied by spin coating onto the first wiring layer 13 to a thickness of about 0.5 $\mu$m. The polyimide film is patterned by photolithography including a step in which the polyimide film is selectively etched by hydrazine hydrate after heat treatment for imide cyclization. Thus, a polyimide film 14 which has a through hole shown in FIG. 2C is formed.

The polyimide resin forming the film 14 is a material which is conventionally used as the insulating film of the semiconductor device. This resin has an imide ring consisting of diamine and tetracarboxylic acid components. Usually, polyamic acid is applied and is cyclized by baking to form the imide ring. Pyromellitic dianhydride or the like is an example of compounds providing the tetracarboxylic acid component. Bis(4-aminophenyl) ether and paraphenylenediamine are examples of compounds providing the diamine component. Alternatively, commercially available materials such as Pyraline (Du Pont de Nemours) and PIQ (Hitachi) can be used.

Figure 2D:
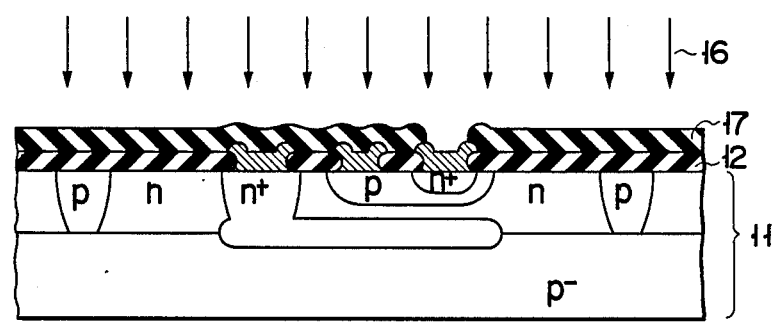

As shown in FIG. 2D, argon ions 16 are implanted into the polyimide film 14 at a dose of $2\times10^{13}$ to $1\times10^{15}$ cm$^{-2}$, at an acceleration voltage of 400 KeV and at an ion beam current of 100 $\mu$A (implanting power: 0.4 W/cm$^2$). Thus, an electrically stable polyimide film 17 is formed.

Figure 2E:
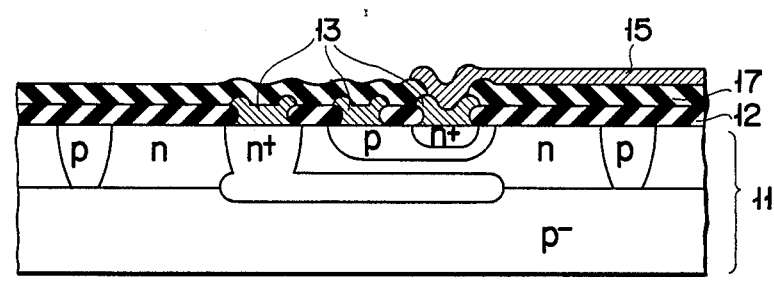

As shown in FIG. 2E, a second wiring layer 15 is formed on the polyimide film 17 in which argon ions 16 have been implanted.

The conditions of the ion implantation for obtaining the electrically stable insulating film 17 can be determined by a measurement of the surface state electron concentration. FIG. 3 is a sample for measurement of a change in surface state electron concentration according to the MOS varactor method. A thermal oxide film (0.1 $\mu$m thickness) 32, a polyimide film (0.3 $\mu$m thickness) 33 to be evaluated, and an electrode (pure aluminum of 1.0 $\mu$m thickness) 34 are sequentially formed on an n-type silicon substrate 31 (volume resistivity: 3 to 5 $\mu$.cm). A voltage V is applied across the electrode 34 for 10 minutes at 200° C. to examine a change in the surface state electron concentration ($\Delta Nss$) of the silicon substrate 31. The results are shown in FIG. 4. When the ions are not implanted, the change in the surface state electron concentration $\Delta Nss$ is $2\times10^{12}$ cm$^{-2}$ as indicated by curve a at an applied voltage of $-5\times10^{15}$ V/cm. However, when the ions are implanted at a dose of $1\times10^{16}$ cm$^{-2}$, at an acceleration voltage of 160 KeV and at an ion beam current of 13 $\mu$A (implanting power: 0.02 W/cm$^2$), the change in the surface state electron concentration $\Delta Nss$ is $1\times10^{10}$ cm$^{-2}$ as indicated by curve b, even if an applied voltage is changed. Furthermore, when $Ar^+$ ions are implanted at a dose of $1\times10^{15}$ cm$^{-2}$, the polyimide film has the characteristics indicated by dotted line c which is substantially the same as curve b.

Figures 5E, 5F:
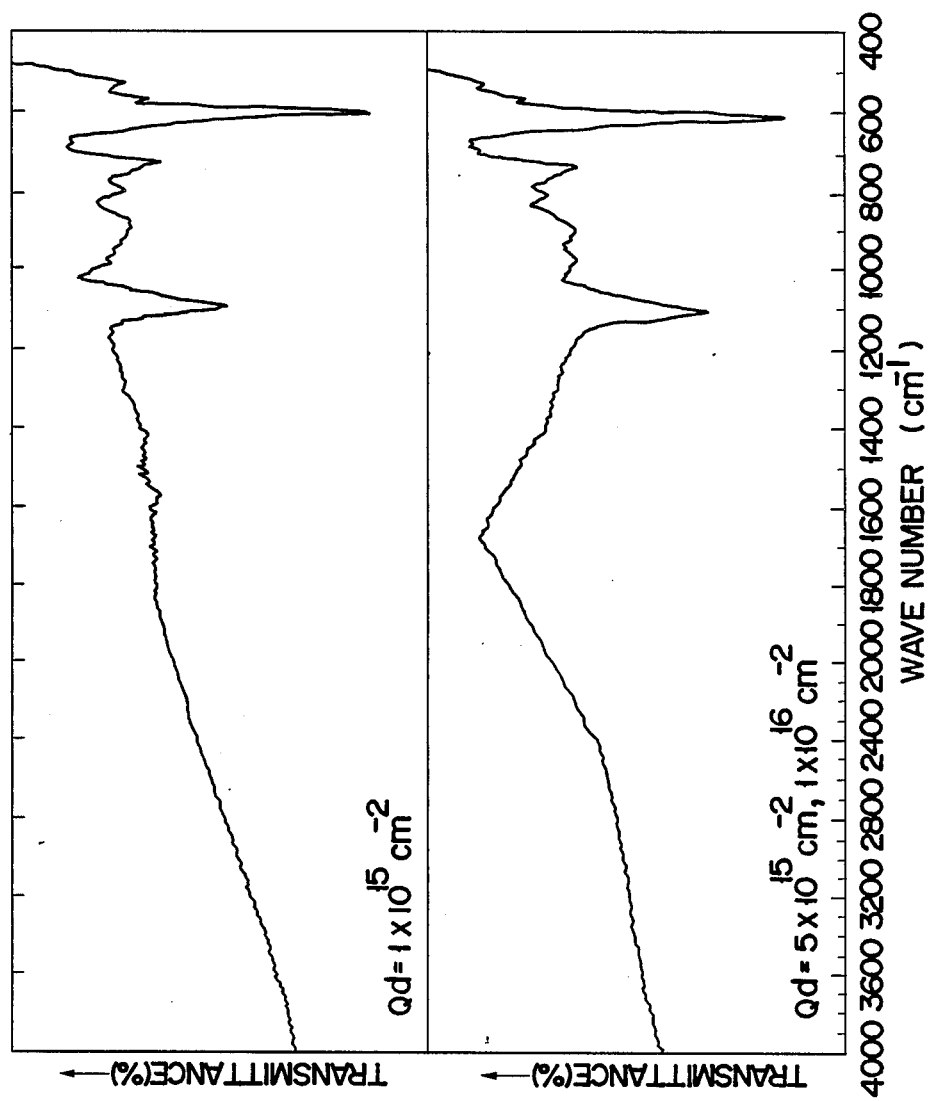

In order to determine a proper amount of $Ar^+$ ions doped in the polyimide film, the amount of $Ar^+$ ions was varied to perform the Fourier transmission infrared (FT-IR) analysis. The results are shown in FIGS. 5A to 5F: FIG. 5A shows a result when a dose Qd is zero; FIG. 5B shows a result when the dose Qd is $1\times10^{12}$ cm$^{-2}$ and an implanting power is 0.002 W/cm$^2$; FIG. 5C shows a result when the dose Qd is $1\times10^{13}$ cm$^{-2}$ and an implanting power is 0.02 W/cm$^2$; FIG. 5D shows a result when the dose Qd is $1\times10^{14}$ cm$^{-2}$ and an implanting power is 0.2 W/cm$^2$; FIG. 5E shows a result when the dose Qd is $1\times10^{15}$ cm$^{-2}$; and FIG. 5F shows a result when the doses Qd are $5\times10^{15}$ cm$^{-2}$ (implanting power: 0.2 W/cm$^2$) and $1\times10^{16}$ cm$^{-2}$ (implanting power: 0.2 W/cm$^2$).

When the dose was increased, the peaks of 1380 cm$^{-1}$(C-N), 1730 cm$^{-1}$ and 1780 cm$^{-1}$

which show the characteristics of polyimide were decreased. When the dose was $1\times10^{15}$ cm$^{-2}$, these peaks completely disappeared. Since other peaks (except for the peak of the silicon wafer) completely disappear, it is seen that polyimide molecules are dissociated at random (polyimide is converted to another material).

Figure 6A:
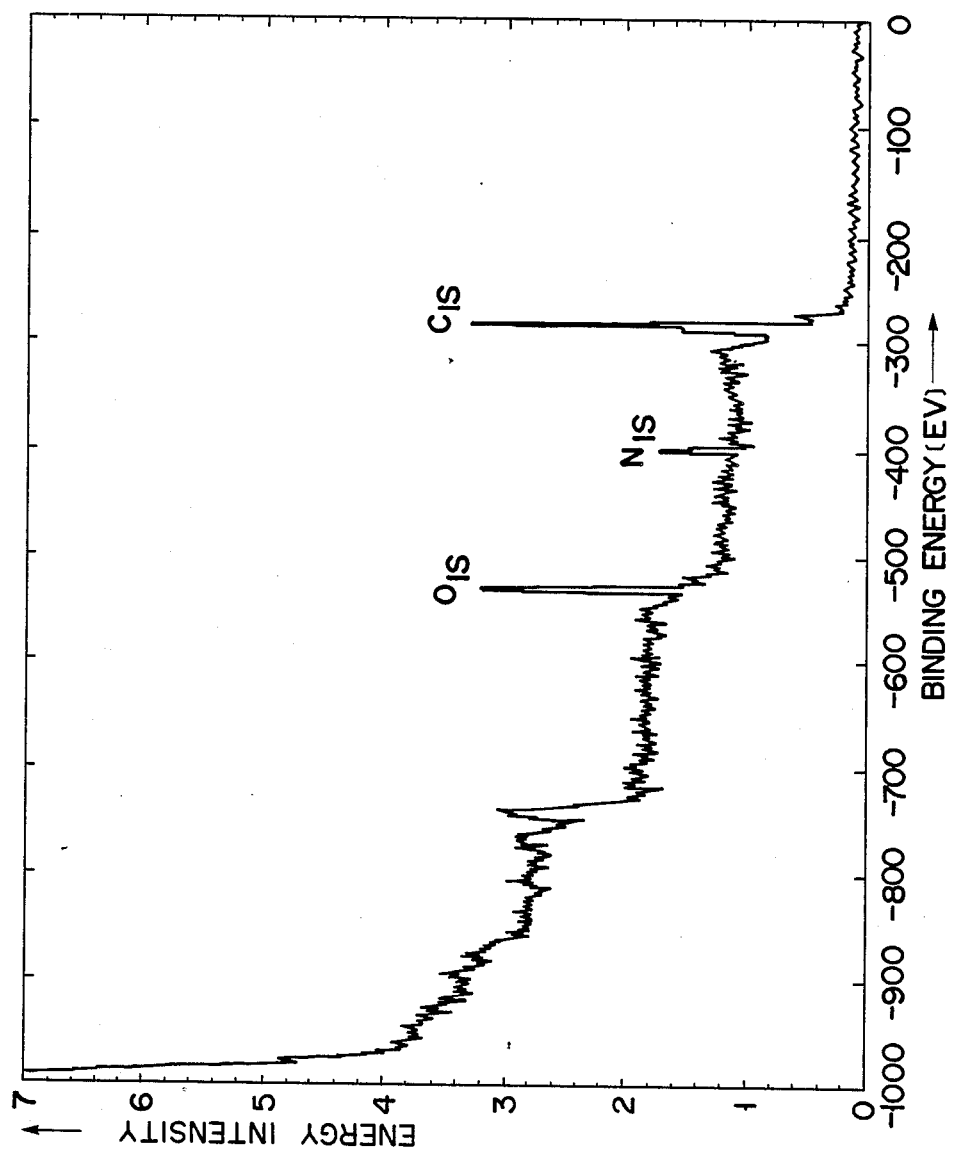
FIGS. 6A to 6D are graphs for explaining the energy intensity of argon ion-implanted and non-implanted polyimide films as a function of the binding energy according to the X-ray probe spectroscopy (XPS) analysis.
Figure 6B:
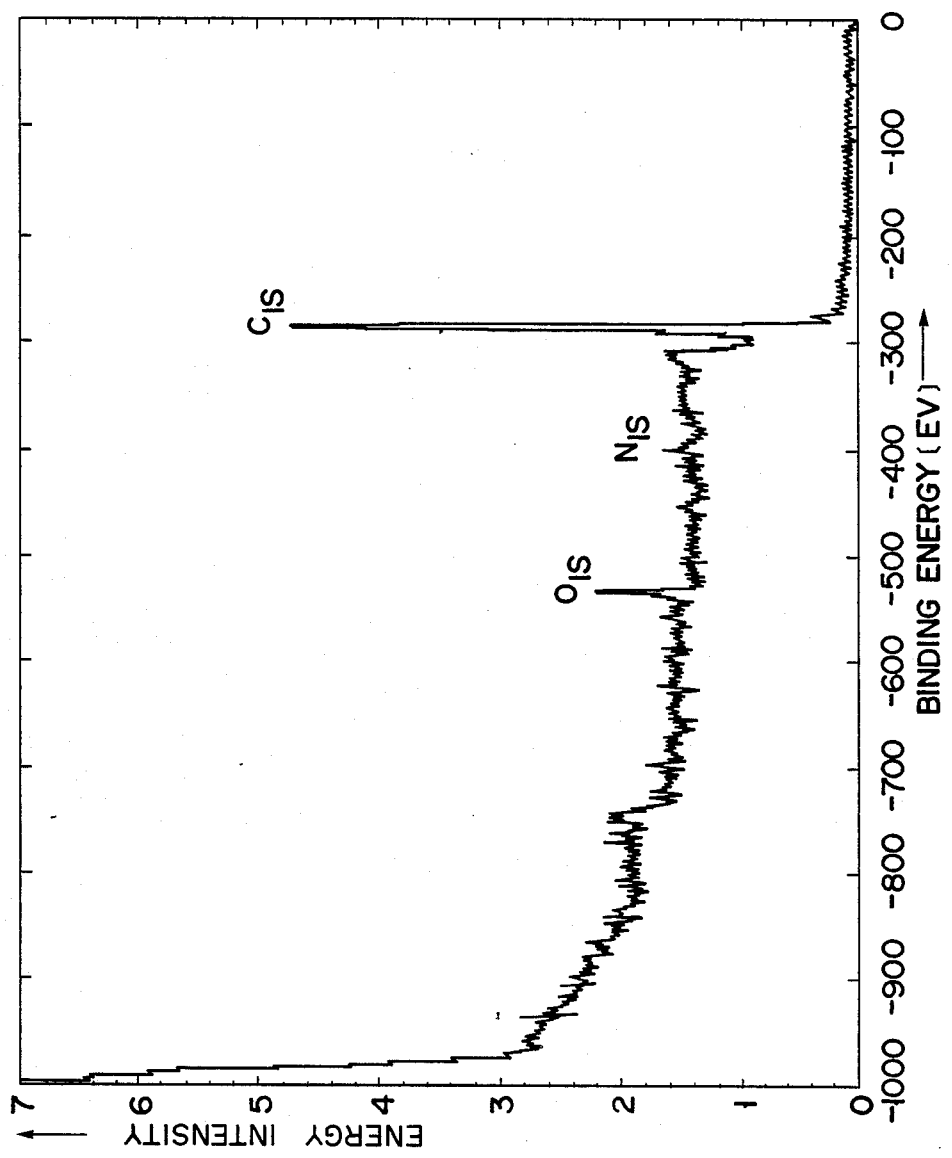
Figure 6C:
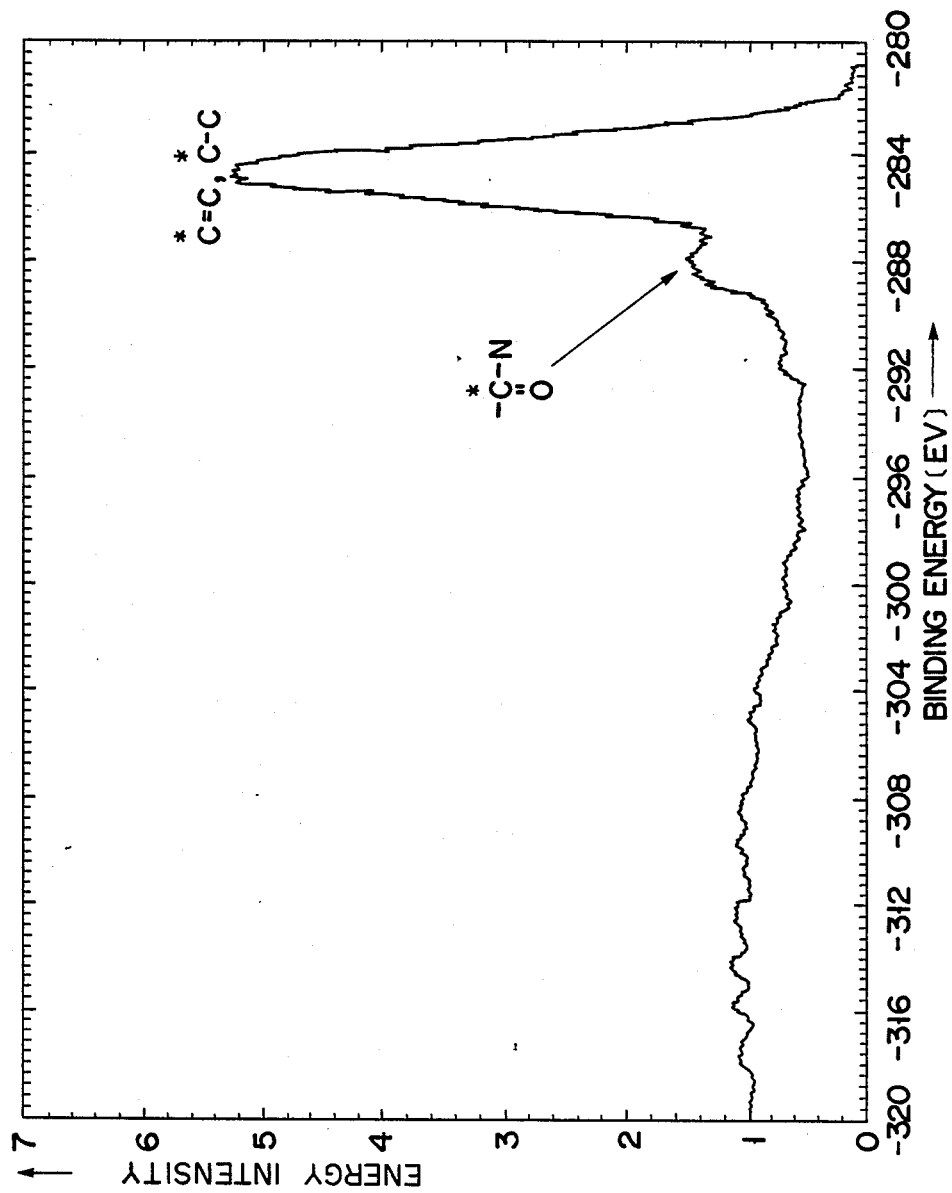
Figure 6D:
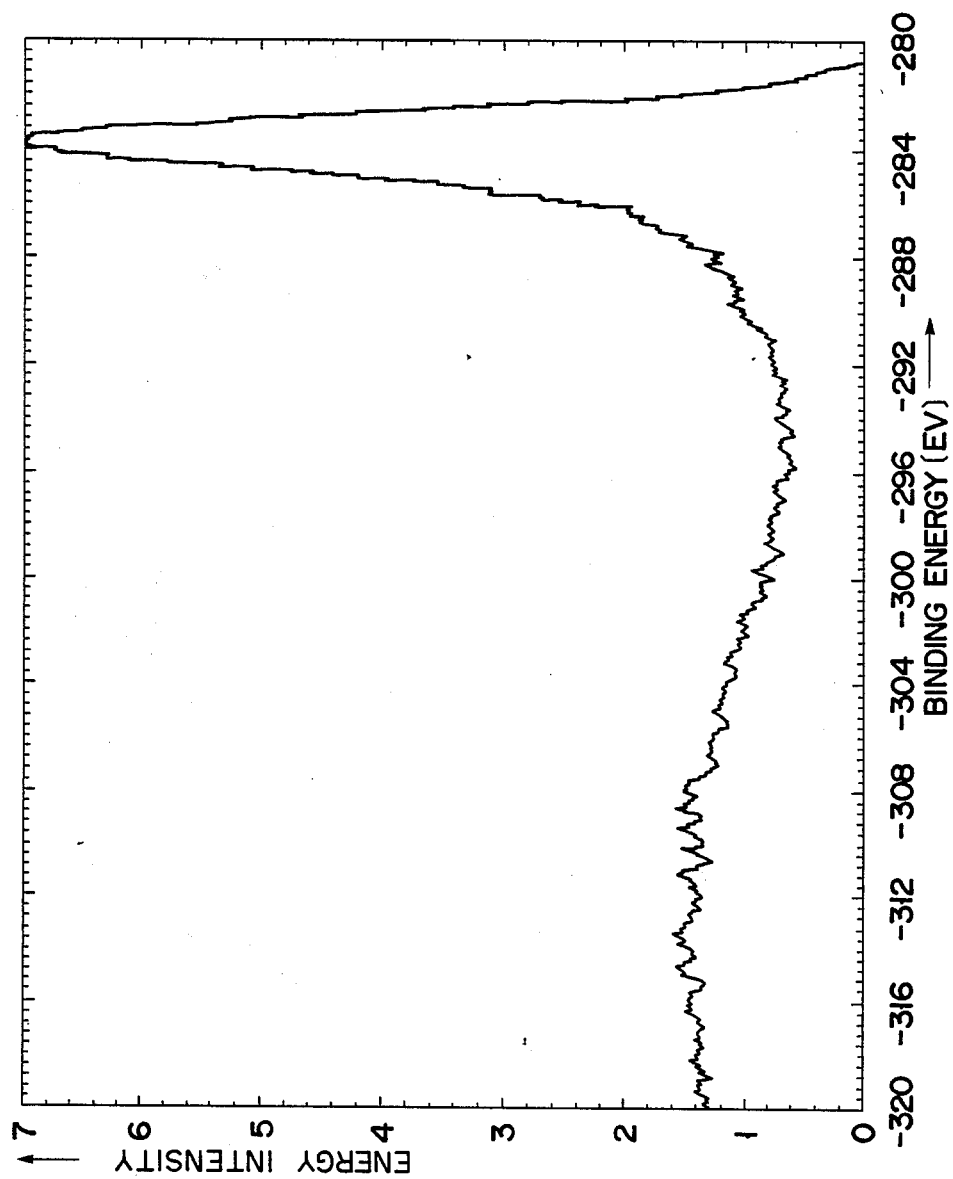

Furthermore, the X-ray probe spectroscopy (XPS spectrum) analysis was performed to examine the relationship between the bonding energy and the energy intensity. FIG. 6A shows an XPS spectrum of non-treated polyimide; FIG. 6B shows an XPS spectrum of polyimide in which Ar+ ions are implanted at a dose of $1 \times 10^{16}$ cm$^{-2}$ and at an implanting power of 0.2 W/cm$^2$; FIG. 6C shows an XPS spectrum of an enlarged $C_{IS}$ portion of non-treated polyimide; and FIG. 6D shows an XPS spectrum of the enlarged $C_{IS}$ portion shown in FIG. 6B. When the XPS spectrum in FIG. 6C is compared with that in FIG. 6D, a peak corresponding to a carbonyl group

disappears by ion-implantation. When the relative intensities corresponding to $O_{IS}$, $N_{IS}$ and $C_{IS}$ are compared with each other with reference to FIGS. 6A and 6B, those of O and N are greatly decreased by ion implantation. It is seen that carbonization in a broad sense has taken place.

FIG. 7 shows relations among the dose Qd of Ar+ ions, the change in the surface state electron concentration ΔNss (voltage applied for the measurement: $-5 \times 10^5$ V/cm), and the volume resistivity ρ. Along with an increase in the dose Qd, the change in the surface state electron concentration ΔNss and the volume resistivity ρ are decreased. The change for the semiconductor device must be about $3 \times 10^{10}$ cm$^{-2}$ or less. The volume resistivity p of a material as an insulator must be $10^9$ ohms-cm or more. Therefore, a practical range of the dose ΔQd is $3 \times 10^{13}$ cm$^{-2}$ to $2.0 \times 10^{15}$ cm$^{-2}$. It is noted that an acceleration voltage was 160 KeV at the time of ion-implantation, and that an ion beam current was 100 μA (implanting power: 0.16 W/cm$^2$). The acceleration voltage varies in accordance with the thickness of the polyimide film. In the test, the thickness of the polyimide film was 0.4 μm to 0.5 μm.

The implanting conditions of Ar+ ions are examined based on the above test results. If the amount of damage to the polyimide film (amount of damage to the polyimide film by implanting of Ar+ ions for random dissociation of the polyimide molecules) is defined as K, the following relation is given:

K = implanting power (W/cm$^2$) × dose Qd (/cm$^2$)

where the implanting power is "acceleration voltage"×"ion beam current (/cm$^2$)". Therefore, $4.5 \times 10^{12}$ (W/cm$^4$) ≦ K ≦ $3.5 \times 10^{14}$ (W/cm$^4$).

When the semiconductor device is formed by the above process, the advantages of the organic insulating film of the semiconductor device may not be impaired, and a highly electrically stable insulating film can be obtained, as indicated by measurements of the characteristics in the above experiments. Thus, a highly reliable multi-layer semiconductor device can be obtained. Furthermore, the wiring layer can be formed in an arbitrary position without necessity to consider the position of the semiconductor element formed thereunder, thus providing a flexible and simple circuit design and decreasing the time required for design greatly.

Furthermore, a highly integrated semiconductor device can be obtained.

What is claimed is:

1. A semiconductor device, comprising:
    a semiconductor substrate;
    at least one semiconductor element formed in one main surface region of the substrate by means of impurity diffusion;
    an insulating film formed on the main surface of the substrate;
    a first wiring layer selectively formed on the insulating film and connected to the semiconductor element formed in the substrate by at least one through-hole made in the insulating film;
    a polyimide film formed as an insulating layer to cover both the first wiring layer and the exposed surface of the insulating film, said polyimide film being provided with at least one through-hole positioned over a part of the first wiring layer, and said polyimide film having implanted therein a controlled dose of ions of an inert element for suppression of polarization; and
    a second wiring layer selectively formed on said polyimide film having ions of the inert element implanted therein and connected via the through-hole made in said polyimide film to said part of the first wiring layer, said semiconductor device being designed to have a potential difference applied between the substrate and said second wiring layer.

2. A semiconductor device according to claim 1, wherein the inert element is argon.

3. A semiconductor device according to claim 2, wherein the dose of the Ar ions ranges between $3 \times 10^{13}$ cm$^{-2}$ and $2 \times 10^{15}$ cm$^{-2}$; and the damage to the polyimide film, i.e., the value of "implanting power (W/cm$^2$)×dose (Qd/cm$^2$)", ranges between $4.5 \times 10^{12}$ (W/cm$^4$) and $3.5 \times 10^{14}$ (W/cm$^4$).

4. A semiconductor device according to claim 1, wherein the insulating film is formed of silicon dioxide.

5. A semiconductor device according to claim 1, wherein the insulating film is formed of silicon nitride.

6. A semiconductor device, comprising:
    a semiconductor substrate;
    at least one semiconductor element formed in one main surface region of the substrate;
    an insulating film formed on the main surface of the substrate;
    a first wiring layer selectively formed on the insulating film and connected to the semiconductor element formed in the substrate by at least one through-hole made in the insulating film;
    a polyimide film formed as an insulating layer to cover both the first wiring layer and the exposed surface of the insulating film, said polyimide film being provided with at least one through-hole positioned over a part of the first wiring layer;
    a second wiring layer selectively formed on said polyimide film and connected via the through-hole made in said polyimide film to said part of the first wiring layer, said semiconductor device being designed to have a potential difference applied between the substrate and said second wiring layer; and
    means in said polyimide film for suppressing polarization of said polyimide film when a potential differing from that applied to the substrate is applied to the second wiring layer, said polarization suppressing means consisting of a dose of inert element ions implanted into said polyimide film.

7. A semiconductor decide according to claim 6, wherein said inert element ions are argon ions.

8. A semiconductor device according to claim 7, wherein the dose of the Ar ions ranges between $3\times10^{13} \text{cm}^{-2}$ and $2\times10^{15}\text{cm}^{-2}$; and the damage to the polyimide film, i.e., the value of "implanting power $(\text{W/cm}^2)\times\text{dose }(\text{Qd/cm}^2)$", ranges between $4.5\times10^{12}$ $(\text{W/cm}^4)$ and $3.5\times10^{14}$ $(\text{W/cm}^4)$.

* * * * *